(12) United States Patent
Qian et al.

(10) Patent No.: US 10,997,351 B1
(45) Date of Patent: May 4, 2021

(54) SYSTEM, METHOD, AND COMPUTER PROGRAM PRODUCT FOR ELECTROMIGRATION-AWARE WIDTH SPACING PATTERN TRACKS

(71) Applicant: Cadence Design Systems, Inc., San Jose, CA (US)

(72) Inventors: Sheng Qian, Sunnyvale, CA (US); Sai Bhushan, Greater Noida (IN); Monica Goel, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/992,205

(22) Filed: Aug. 13, 2020

(51) Int. Cl.
*G06F 30/392* (2020.01)
*G06F 30/3308* (2020.01)

(52) U.S. Cl.
CPC ........ *G06F 30/392* (2020.01); *G06F 30/3308* (2020.01)

(58) Field of Classification Search
CPC .......................... G06F 30/392; G06F 30/3308
See application file for complete search history.

(56) References Cited

U.S. PATENT DOCUMENTS

| | | | |
|---|---|---|---|
| 9,104,830 B1* | 8/2015 | Salowe | G06F 30/394 |
| 9,396,301 B1* | 7/2016 | Lee | G06F 30/394 |
| 9,454,634 B1* | 9/2016 | Kukal | G06F 30/394 |

\* cited by examiner

*Primary Examiner* — Stacy Whitmore
(74) *Attorney, Agent, or Firm* — Mark H. Whittenberger, Esq.; Holland & Knight LLP

(57) ABSTRACT

Embodiments included herein are directed towards method for electronic design. Embodiments may include receiving, using at least one processor, a placed layout and one or more electronic design simulation datasets including current information associated with at least one pin. Embodiments may further include estimating a width to support the current information associated with the at least one pin and updating a pin size associated with the at least one pin based upon, at least in part, the estimated width. Embodiments may also include identifying at least one pin that is above a predetermined threshold and splitting the at least one pin that is above the predetermined threshold into a plurality of pins. Embodiments may further include generating one or more width-spacing-pattern tracks for one or more internal nets based upon, at least in part, the updated pin size.

20 Claims, 15 Drawing Sheets

Width of the track required (Horizontal Direction) := MAX($\sum$ of currents from all sources/sinks in each row.)
Width of the track required (Vertical Direction) := MAX($\sum$ of currents from all sinks in rows above & below).

SYSTEM, METHOD, AND COMPUTER PROGRAM PRODUCT FOR ELECTROMIGRATION-AWARE WIDTH SPACING PATTERN TRACKS

GOVERNMENT RIGHTS

This invention was made with Government support under Agreement No. HR0011-18-3-0010, awarded by DARPA. The Government has certain rights in the invention.

FIELD OF THE INVENTION

The present disclosure relates to electronic circuit design, and more specifically, to the automatic creation of electromigration-aware width spacing pattern tracks.

DISCUSSION OF THE RELATED ART

In existing electronic design approaches, designers may utilize width spacing patterns ("WSP") as a graphical editing modes for generating circuit board tracks. WSP is a concept built to help routers to perform design rule checks ("DRC") correct routing easily. Existing WSPs only comply with the various DRC. However, these WSPs are not incorporating electromigration requirements and thus tracks can be designed that are physically correct but still may fail validation steps later in the design process.

SUMMARY

In an implementation of the present disclosure a computer-implemented method for electronic design is provided. The method may include receiving, using at least one processor, a placed layout and one or more electronic design simulation datasets including current information associated with at least one pin. The method may further include estimating a width to support the current information associated with the at least one pin and updating a pin size associated with the at least one pin based upon, at least in part, the estimated width. The method may also include identifying at least one pin that is above a predetermined threshold and splitting the at least one pin that is above the predetermined threshold into a plurality of pins. The method may further include generating one or more width-spacing-pattern tracks based upon, at least in part, the updated pin size.

One or more of the following features may be included. Generating, may be based upon, at least in part, a location of one or more devices at the placed layout. Splitting may be based upon, at least in part, a number of rows associated with one or more devices at the placed layout. Generating may include determining a width of the one or more width-spacing-pattern tracks. Generating may also include determining a periodicity of the one or more width-spacing-pattern tracks. Receiving may include receiving current information for at least one device terminal pair associated with an internal net. The current information for at least one device terminal pair may include source information and sink information. Generating a width of the one or more width-spacing-pattern tracks for one or more internal nets may be based upon, at least in part, the source information and the sink information.

In another implementation of the present disclosure a non-transitory computer-readable storage medium having stored thereon instructions, which when executed by a processor result in one of more operations is provided. Operations may include receiving, using at least one processor, a placed layout and one or more electronic design simulation datasets including current information associated with at least one pin. Operations may further include estimating a width to support the current information associated with the at least one pin and updating a pin size associated with the at least one pin based upon, at least in part, the estimated width. Operations may also include identifying at least one pin that is above a predetermined threshold and splitting the at least one pin that is above the predetermined threshold into a plurality of pins. Operations may further include generating one or more width-spacing-pattern tracks for one or more internal nets based upon, at least in part, the updated pin size.

One or more of the following features may be included. Generating, may be based upon, at least in part, a location of one or more devices at the placed layout. Splitting may be based upon, at least in part, a number of rows associated with one or more devices at the placed layout. Generating may include determining a width of the one or more width-spacing-pattern tracks. Generating may also include determining a periodicity of the one or more width-spacing-pattern tracks. Receiving may include receiving current information for at least one device terminal pair associated with an internal net. The current information for at least one device terminal pair may include source information and sink information. Generating a width of the one or more width-spacing-pattern tracks for one or more internal nets may be based upon, at least in part, the source information and the sink information.

In yet another implementation of the present disclosure a system for electronic design is provided. The system may include a memory and at least one processor configured to receive a placed layout and one or more electronic design simulation datasets including current information associated with at least one pin. The at least one processor may be further configured to estimate a width to support the current information associated with the at least one pin. The at least one processor may be further configured to update a pin size associated with the at least one pin based upon, at least in part, the estimated width. The at least one processor may be further configured to identify at least one pin that is above a predetermined threshold and to split the at least one pin that is above the predetermined threshold into a plurality of pins. The at least one processor may be further configured to generate one or more width-spacing-pattern tracks for one or more internal nets based upon, at least in part, the updated pin size.

One or more of the following features may be included. Generating, may be based upon, at least in part, a location of one or more devices at the placed layout. Splitting may be based upon, at least in part, a number of rows associated with one or more devices at the placed layout. Generating may include determining a width of the one or more width-spacing-pattern tracks.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
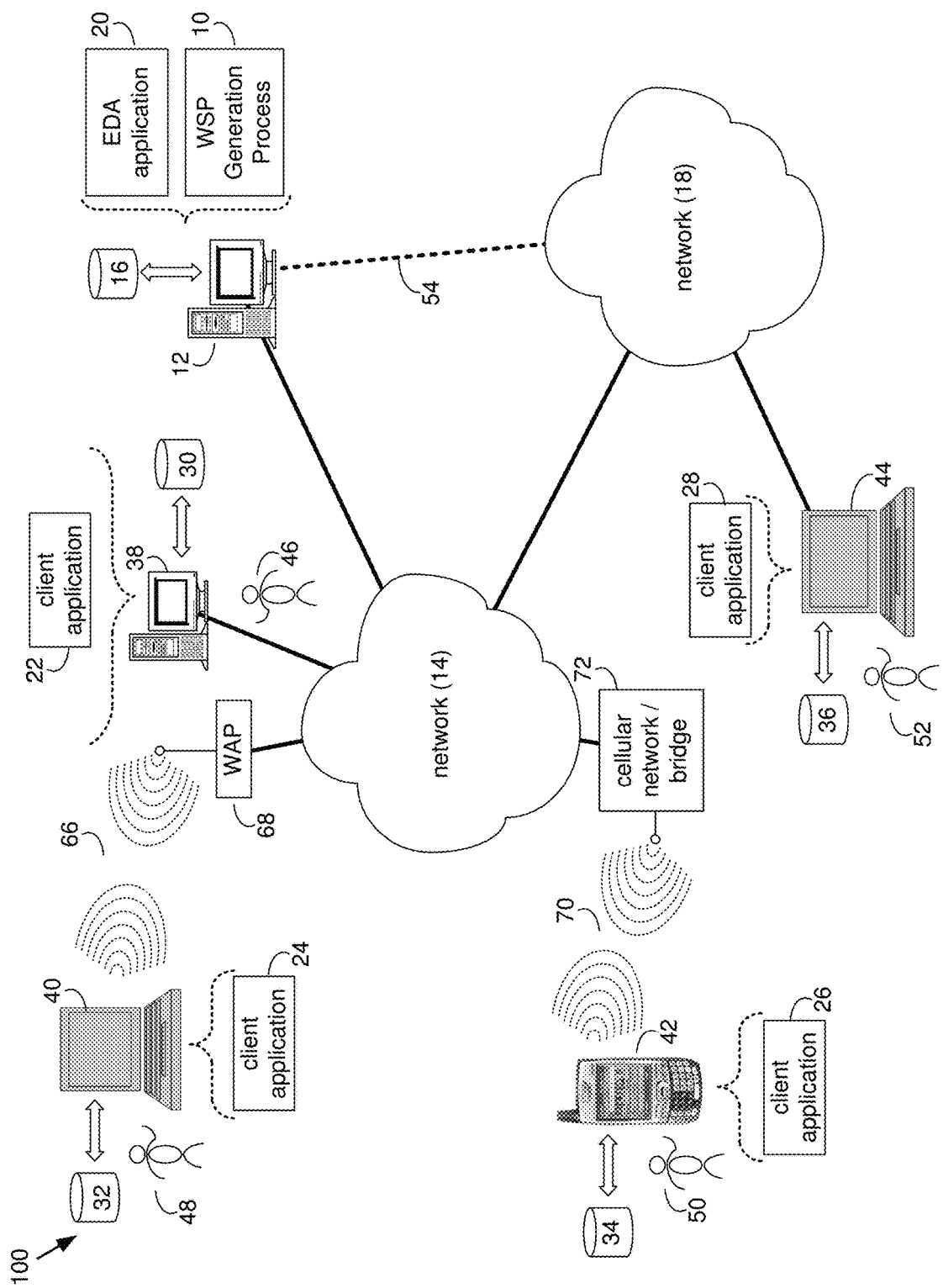
FIG. 1 is a diagram depicting an embodiment of a system in accordance with the present disclosure.

Embodiments of the present disclosure are directed towards a system and method that uses simulation currents of a sized schematic as an input and then uses those features to determine the width of the tracks for different nets depending on the current requirements for each net. The system may utilize parasitics in addition to the sized schematic as an input. Additionally, the track widths and track information may be provided to the router so that it may route the nets on appropriate tracks and ensure no electromigration violations.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosures. Some hardware description languages may include, but are not limited to, Verilog, VHDL, and Verilog-AMS. Various other hardware description languages may also be used as well.

Referring to FIG. 1, there is shown electromigration-aware ("EM-aware") WSP generation process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, process 10 may reside on and be executed, in whole or in part, by a client electronic device, such as a personal computer, notebook computer, personal digital assistant, or the like.

The instruction sets and subroutines of EM-aware WSP generation process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

EM-Aware WSP generation process 10 may be a stand-alone application, or may be an applet/application/script that may interact with and/or be executed within EDA application 20. In addition/as an alternative to being a server-side process, the prediction process may be a client-side process (not shown) that may reside on a client electronic device (described below) and may interact with an EDA client application (e.g., one or more of EDA client applications 22, 24, 26, 28). Further, the prediction process may be a hybrid server-side/client-side process that may interact with EDA application 20 and an EDA client application (e.g., one or more of client applications 22, 24, 26, 28). As such, the processes may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize prediction process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54. Some or all of the operations discussed herein with regard to prediction process 10 may be performed, in whole or in part, in the cloud as a cloud-based process including, for example, networks 14, 18 and any others.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

Figure 2:
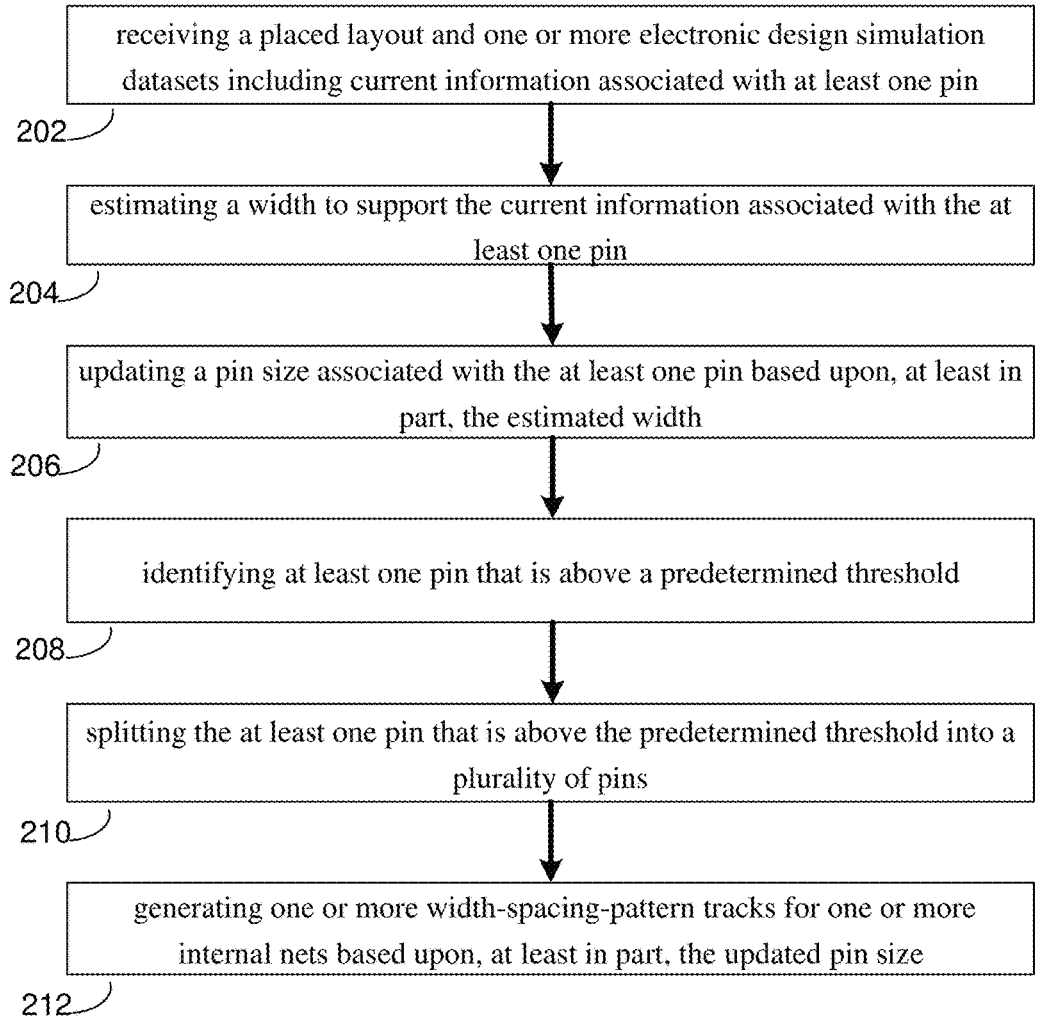
FIG. 2 is a flowchart depicting operations consistent with an electromigration-aware ("EM-aware") WSP generation process in accordance with an embodiment of the present disclosure.
Figure 3:
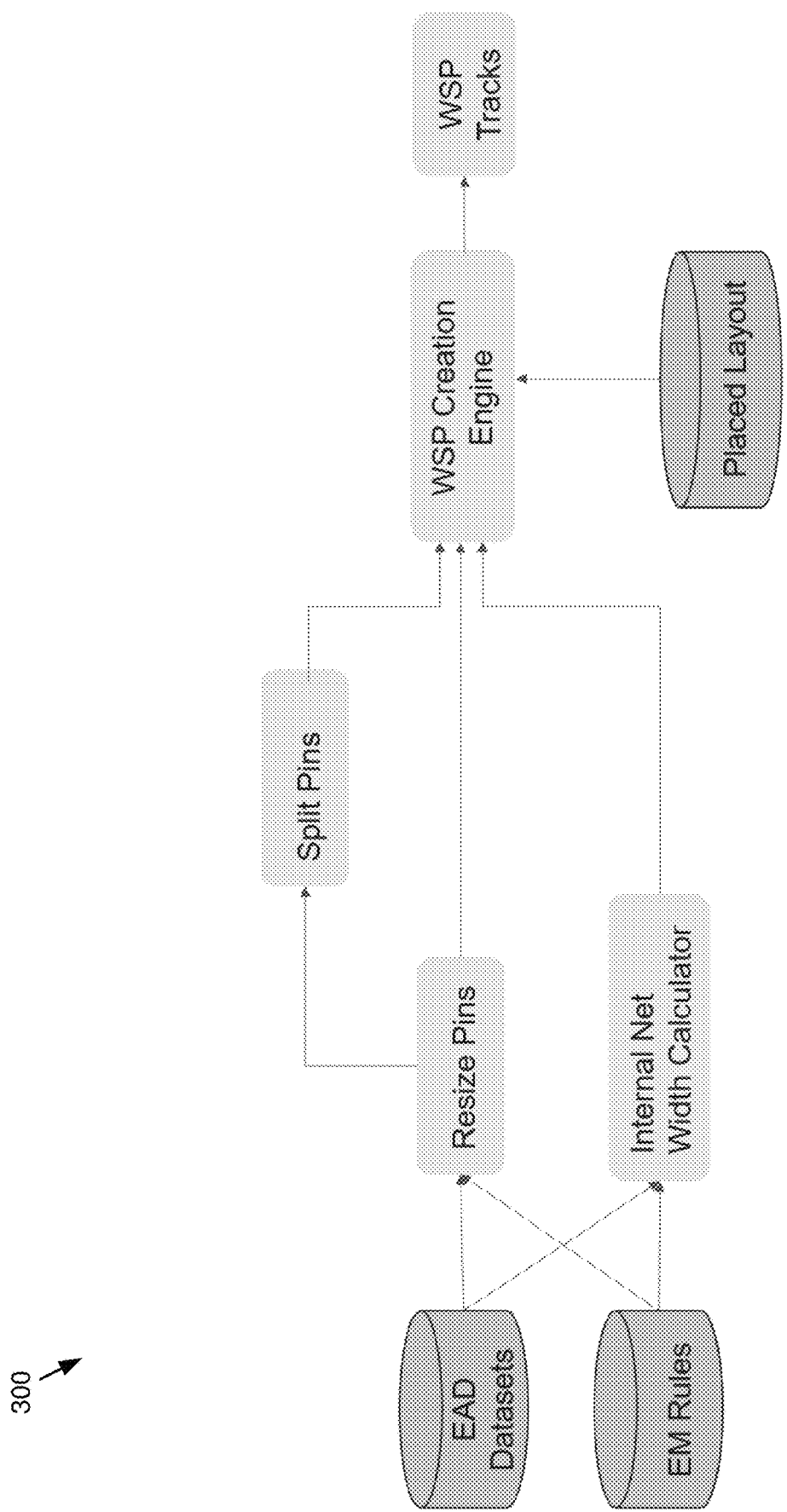
FIG. 3 is a flowchart depicting operations consistent with an EM-aware WSP generation in accordance with an embodiment of the present disclosure.

Referring now to FIG. 2, an example flowchart depicting operations consistent with an embodiment of EM-aware WSP generation process 10 is provided. The process may include receiving (202), using at least one processor, a placed layout and one or more electronic design simulation datasets including current information associated with at least one pin. The method may further include estimating (204) a width to support the current information associated with the at least one pin and updating (206) a pin size associated with the at least one pin based upon, at least in part, the estimated width. The method may also include identifying (208) at least one pin that is above a predetermined threshold and splitting (210) the at least one pin that is above the predetermined threshold into a plurality of pins. The method may further include generating (212) one or more width-spacing-pattern tracks for one or more internal nets based upon, at least in part, the updated pin size. Numerous other operations are also within the scope of the present disclosure.

Referring now to FIGS. 3-21, embodiments of EM-aware WSP generation process 10 may be configured to simulate currents of a sized schematic with or without parasitics as an input and then use those features to determine the width of the tracks for different nets depending on the current requirements for each net. In some embodiments, the widths and track information may be provided to the router so that it may route the nets on appropriate tracks and ensure that no electromigration violations occur.

In conventional approaches, an EDA designer has no EM-aware WSP tracks to assist with device-level routing for leaf-level blocks. In IC design, a block is a reusable unit of logic. Blocks may be hierarchical, e.g., one block can contain other blocks in it. A leaf level block is a functional unit at the lowest level of hierarchy, which comprises of a small number of primitive devices (e.g., transistors, resistors, capacitors). In these conventional approaches, the issues reported during EM analysis may be fixed in the verification step after routing is complete.

In contrast, embodiments of EM-aware WSP generation process 10 may create WSP tracks using widths that are both physically correct (as per DRC rules) and electrically correct (as per EM rules) before the routing step. In other words, the EM-aware WSP tracks generated herein may help the router to choose tracks that are both DRC correct and free from any electro-migration issues.

In some embodiments, automatic generation of EM-aware WSP tracks may assist device-level routing for leaf-level blocks. In some embodiments, EM-aware WSP generation process 10 may be utilized in a row-based placement style, however, it should be noted that any placement style may be employed without departing from the scope of the present disclosure. Using the EM-aware WSP tracks described herein, the router generates results that are of much better quality. As a result, post-routing adjustments/fixes are no longer required, saving both time and effort.

If a user is utilizing WSP tracks and the WSP tracks are not wide enough to support the required current, then electromigration issues may occur. These electromigration issues may be flagged as a violation by the tool performing EM analysis resulting a change in the widths of the routing path-segments at the verification step (e.g., post-routing). This may lead to cascading effects and further changes in the layout starting the process over. EM-aware WSP generation process 10 may calculate the correct, EM-aware, width to avoid that additional overhead of expensive design alteration during the verification step.

Referring again to FIG. 3, flowchart 300 depicts an example of electromigration-aware WSP generation in accordance with an embodiment of the present disclosure. Given a particular schematic, EM-aware WSP generation process 10 may be configured to generate WSP tracks using a WSP generation engine. WSP generation engine may generate one or more WSP tracks based upon, at least in part, electrically aware design ("EAD") datasets, EM rules and one or more placed layouts. EAD Datasets are electrical datasets that may include current information for the instance terminals in the design hierarchy and also top-level terminal pins. The most common source of current information is from a simulation, however, the user can also provide this information manually based on his/her expertise. This current information may be stored either within the design or in an external file. EM rules are the electromigration rules defined in the technology file provided by the foundry. These rules may be used to determine the current carrying capacity of a conductor of a given material and width. A "placed layout", as described herein, may correspond to a layout design that has gone through the placement process, with devices having been placed in the appropriate locations and the design therefore ready for routing the net connections.

In some embodiments, a placed layout may include a sized schematic and may represent the layout of the schematic and may include localized effects of individual devices. In other embodiments, a placed layout may include a sized schematic and calculations for expected parasitics. Parasitics are electrical effects, caused by a physical implementation of the circuit, which may adversely impact circuit behavior. Three main classes of parasitics are resistance, capacitance and inductance. Each box or cylinder in flowchart 300 represents for example, but not limited to, a series of steps, calculations, processes, datasets, rules, and/or layouts.

In some embodiments, WSP generation process 10 may utilize inputs such as EAD datasets and EM rules may be used to resize and/or split one or more pins. In some embodiments, where a split pin is not required, the process may only perform pin resizing. In this way, different pins may carry different currents and if the current is large, using a lesser width may result in electromigration issues.

In some embodiments, if one or more pins are very wide due to a large current, the pins may be split into multiple pins. Split pins may be based upon any suitable metric, some of which may include, but are not limited to, the number of rows of devices the pins need to connect to. In some embodiments, the placement of pins may be arranged such that each of the split-pins may feed/draw currents from the rows closest to it. This may occur, for example, in power and/or ground nets and nets that connect to large number of devices across multiple rows. Accordingly, resizing the pins may help mitigate electromigration issues.

In some embodiments, resizing and/or splitting pins, as represented in flowchart 300, may include various processes configured to take user inputs and determine the proper size, proper number of pins, and/or location of the pins. For example, in some embodiments, resizing pins may include, but is not limited to, reading simulation datasets, or any other source of currents, for the pins, calculating the width required to support the current on the pin, and updating the size of pins to match the recommended width.

In some embodiments, the width required to support the current on the pin may be calculated in a pre-routing step, and the calculated width may be a pessimistic width. In some embodiments, when the calculated width of pin is very large then the pin may be split into multiple pins. A pin may be considered a very large pin when the width is some amount larger (e.g. three times, etc.) than the minimum width ("min-width") in the design rules. An example min-width may be 0.032 microns, however other widths may be used in embodiments of the disclosure. In some embodiments, the amount of pin splitting may be based upon, at least in part, the min-width for the pin-layer, the number of rows to which the pin connects to, etc.

In some embodiments, inputs such as the EAD Datasets and EM Rules discussed above may be utilized to calculate an internal net width using an internal net width calculator. The outputs from the internal net width calculator may be provided as an input to WSP generation Engine, which may then create one or more WSP tracks. For internal nets, the currents for the device-terminals may be read from the simulation data. In some embodiments, one or more device-terminals may be split into multiple categories (e.g., source and sink) based on the direction of currents. The track widths may be computed based upon various factors, such as the total source current required for the row. Additional operations regarding the internal net width calculator are discussed in further detail below with reference to FIGS. 12-15.

Figure 4:
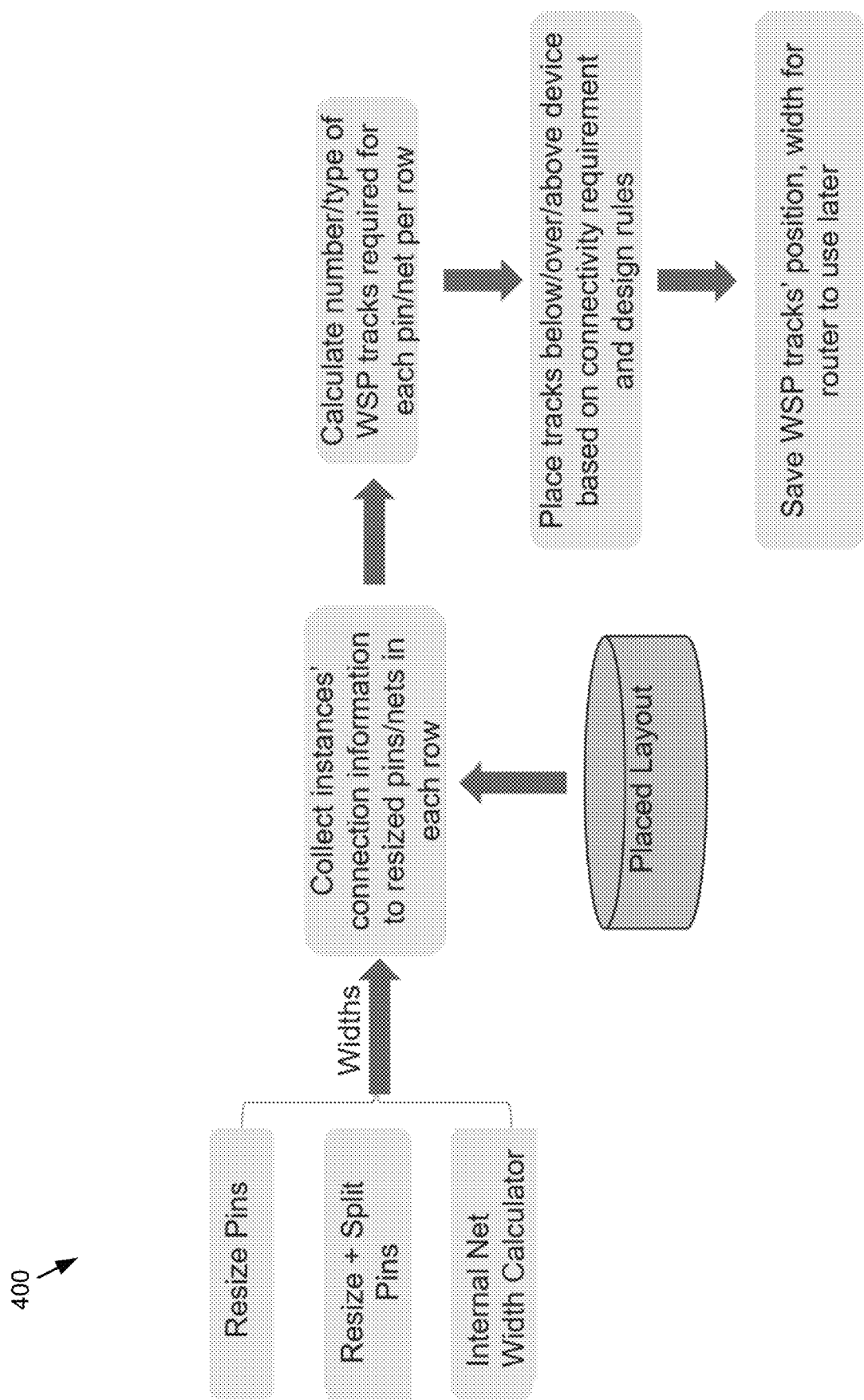
FIG. 4 is a flowchart depicting operations consistent with an EM-aware WSP generation engine in accordance with an embodiment of the present disclosure.

Referring now to FIG. 4, flowchart 400 depicts a WSP generation engine in accordance with an embodiment of the present disclosure. Accordingly, WSP generation process 10 may receive width information and the placed layout to determine connection information between the one or more instances and the resized pins/nets in each row. Using that information, WSP generation Engine may calculate the number/type of WSP tracks required for each pin/net per row. In some embodiments, WSP generation Engine may place tracks below/over/above a device based on connectivity requirements and design rules. After the WSP tracks are created, WSP generation engine may save WSP tracks' position and width for the router to use later.

In some embodiments, each row's WSP pattern may be different because the pattern may be determined by factors such as devices placed in that row and what net these devices may be connected to. An empty row, for example, a row without devices, may have all tracks min-width by default.

Figure 5:
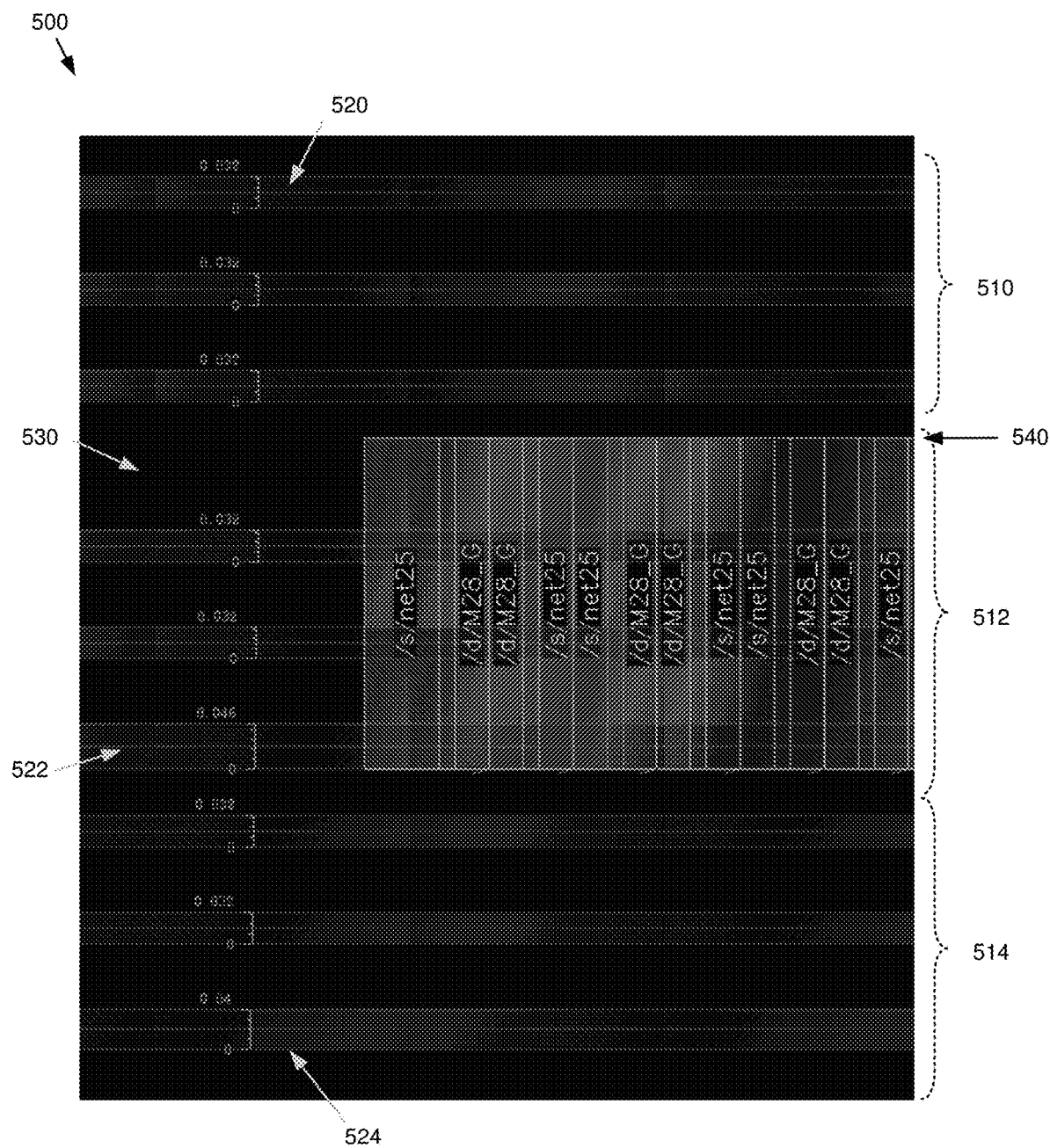
FIG. 5 depicts an example WSP created in accordance with an embodiment of the present disclosure.

In some embodiments, and referring also to FIG. 5, there may be three virtual regions per row, namely, above-device WSP tracks, over-device WSP tracks, and below-device WSP tracks. Over-device WSP tracks may be used for connecting source/drain. Above-device and below-device WSP tracks may be used for connecting gate/source/drain. Each region may have a set number to control the number of WSP tracks to be created.

In some embodiments, the set number of WSP tracks may be referred to as "MAXIMUM_NUMBER." In other embodiments, if the number of tracks in each region is smaller than the MAXIMUM_NUMBER, WSP tracks with min-width may be created until the number of WSP tracks are equal to MAXIMUM_NUMBER. In some embodiments, for each resized pin, WSP tracks may be created with resized width.

In some embodiments, the calculated space between the WSP tracks may follow design rules to avoid potential routing DRC. In other embodiments, the spacing between the WSP may strictly follow design rules. If WSP tracks in some rows require a taller row region to satisfy design rules, the row region may be recreated to satisfy WSP tracks and devices would be re-snapped.

Referring again to FIG. 5, an example placed layout 500 showing WSP tracks is provided. Layout 500 depicts a portion of placed layout showing one row and includes: above device tracks 510, over device tracks 512, below device tracks 514, min-width track 520, ground track 522, gate track 524, spacing 530, and device 540. Layout 500 was created for an amplifier cell (e.g., "bias_amp") and includes pin-splitting.

In this particular example, the track regions have been generated with a maximum of three tracks, i.e. MAXIMUM_NUMBER: 3. Above device tracks 510 may be used to connect to gate/source/drain terminals of a transistor. The three tracks contained within above device tracks 510 are min-width track 520. Each of the min-width tracks 520 have the same width. Specifically, in this example, min-width track 520 has a width of 0.032 microns as specified by the design rules, but other widths may be utilized. The over device tracks 512 may be used to connect to source/drain terminals of a transistor. In example WSP 500, two of the tracks are min-width tracks 520 and the third track is ground track 522. Ground track 522 needs to be wider than min-width track 520, since it is connected to ground net ("gnd"). Ground track 522 has a width of 0.046 to account for the increased current. The below device tracks 514 may be used to connect to gate/source/drain terminals of a transistor. In example WSP 514, two of the tracks are min-width tracks 520 and the third track is a gate track 524 to be connected to gate net ("in_p"). The spacing in this example also follows design rules. In some embodiments, EM-aware WSP generation process 10 may create more space between devices, between tracks and/or between devices and tracks based on, at least, EM rules and EAD datasets. Specifically, in FIG. 5, there is additional spacing 530 included between above device tracks 510, over device tracks 512, and device 540.

In some embodiments, and as shown in layout 500, WSP generation process 10 may include connections at gate track 524 for block pins (in_p); source ("net25") and drain ("M28_G") connections in the region for over device tracks 512. Net "net25" is an internal net and represents connections to a transistor's source (S) terminal. Net "M28_G" is an internal net and represents connections to a transistor's drain (D) terminal.

Referring also to FIGS. 6-11, example layouts consistent with embodiments of WSP generation process 10 are depicted. Specifically, the WSP generated in each figure is for the cell: "bias_amp" and one net in the layout: "bias". The term "bias_amp" is the name of the leaf-level block/design that was used to illustrate the work on EM-aware WSP generation. The term "bias" is the name of a net within that leaf-level block/design which had special width requirements based on the current information for its pin in the simulation datasets and therefore required special tracks based on EM recommendation. These special tracks were automatically generated by this EM-aware WSP generation engine.

In each figure different generation options are provided to depict outcomes from different embodiments of the disclosure. As discussed in further detail hereinbelow, FIGS. 6-7 use a min-width approach to generate the WSP, FIGS. 8-9 use a multi-width routing approach using EM-aware WSP, and FIGS. 10-11 use a multi-width routing approach using EM-aware WSP with pin splitting.

Figure 6:
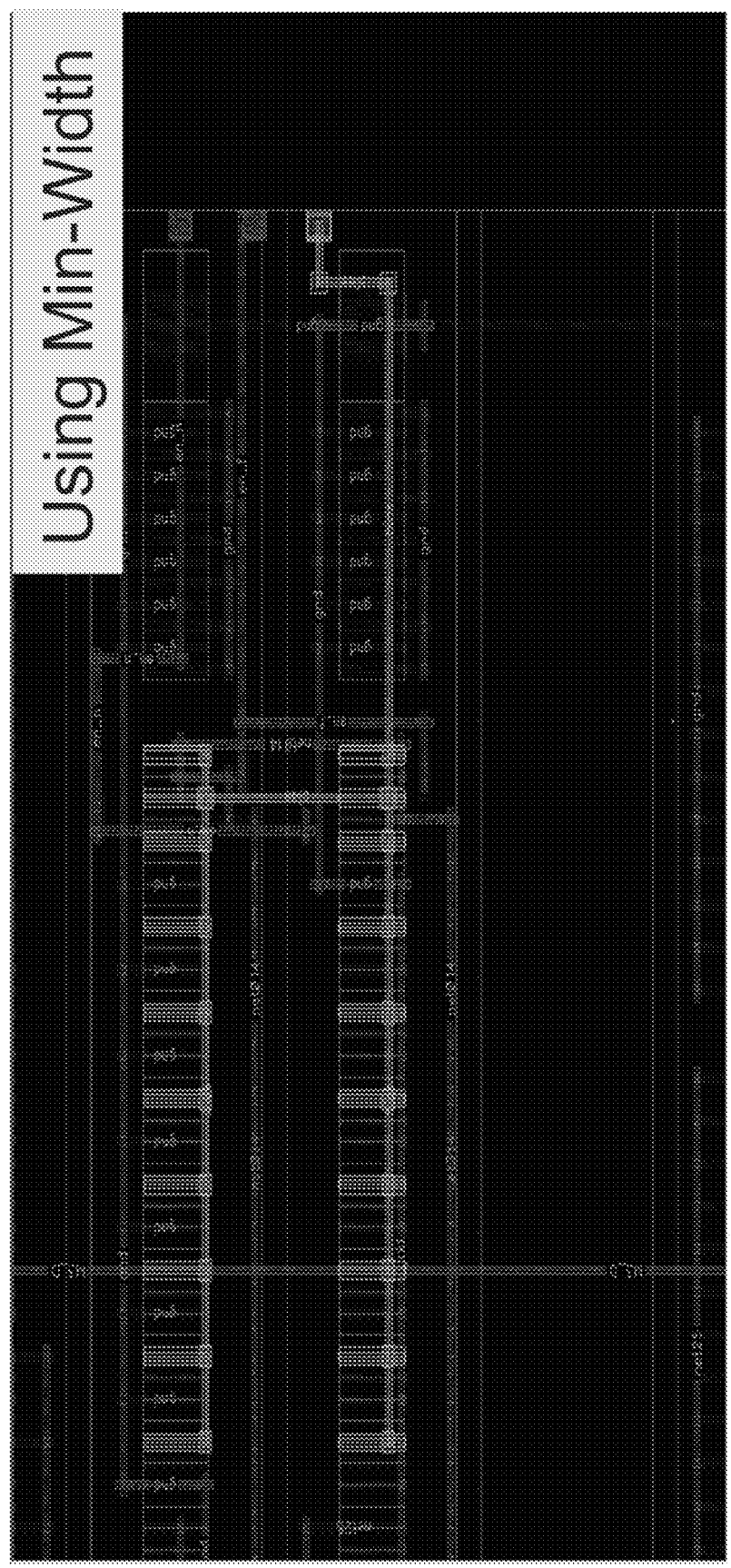
FIG. 6 is an example WSP depicting tracks generated from a WSP generation engine utilizing a min-width routing.
Figure 7:
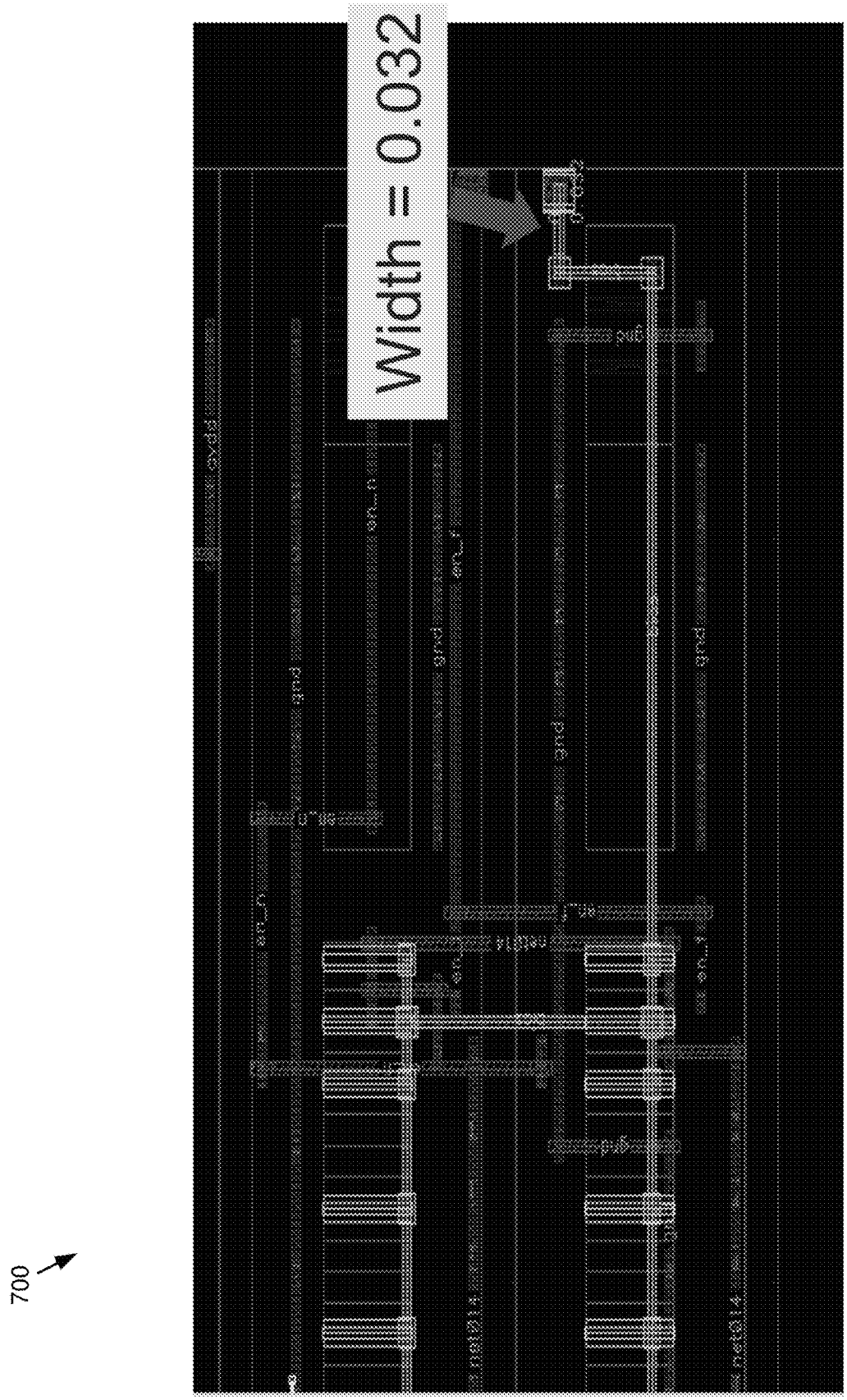
FIG. 7 depicts a closer view of the example WSP of FIG. 6 showing track widths.

FIG. 6 depicts an example WSP for the cell: "bias_amp" and the "bias" net created with a min-width approach. As shown in FIG. 7, the track width for the net "bias" is equal to 0.032 microns, the min-width in the design rules. In this conventional approach no EM effects were taken into account.

Figure 8:
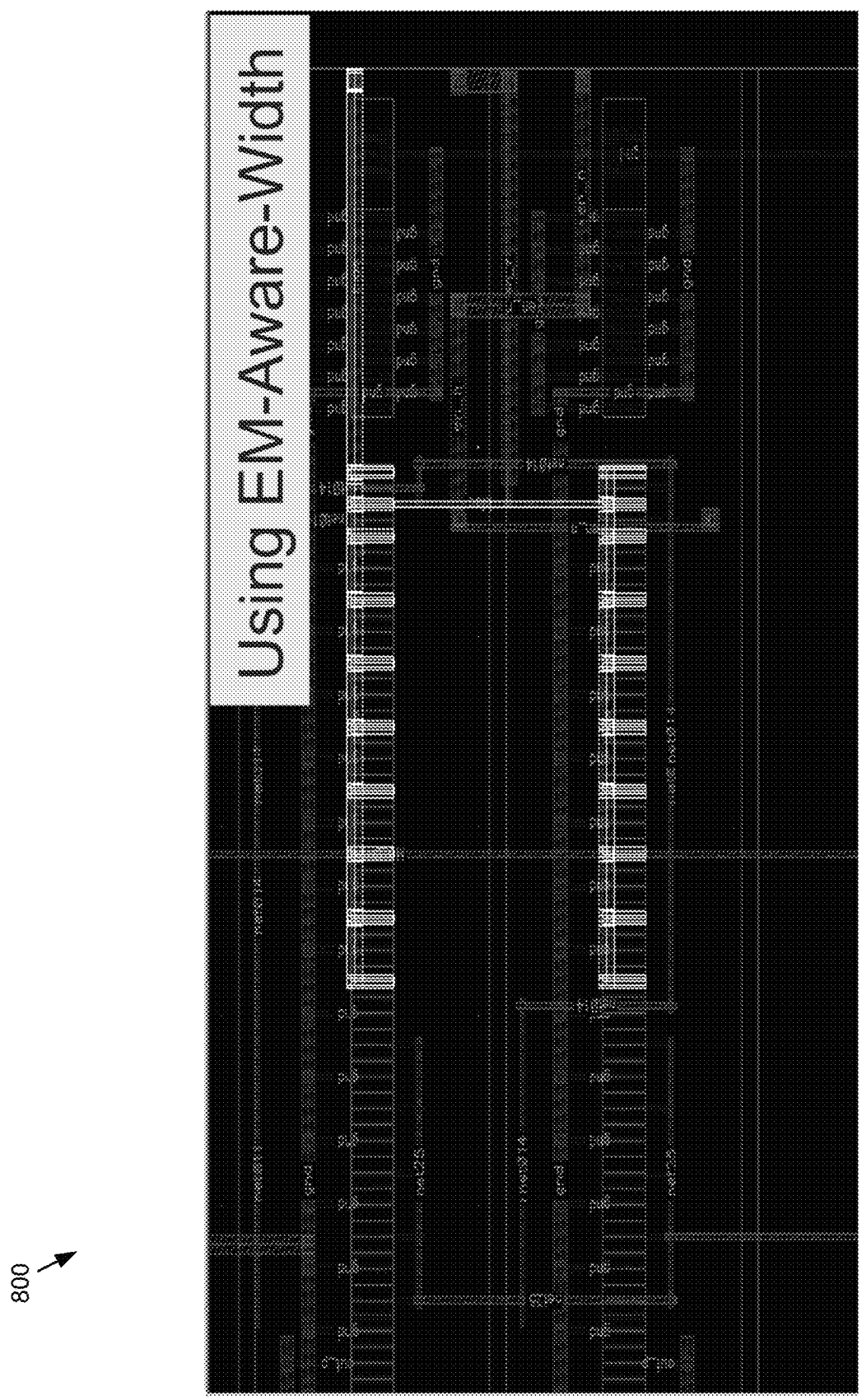
FIG. 8 is an example WSP depicting tracks generated from a WSP generation engine utilizing multi-width routing with EM-aware WSP option in accordance with an embodiment of the present disclosure.
Figure 9:
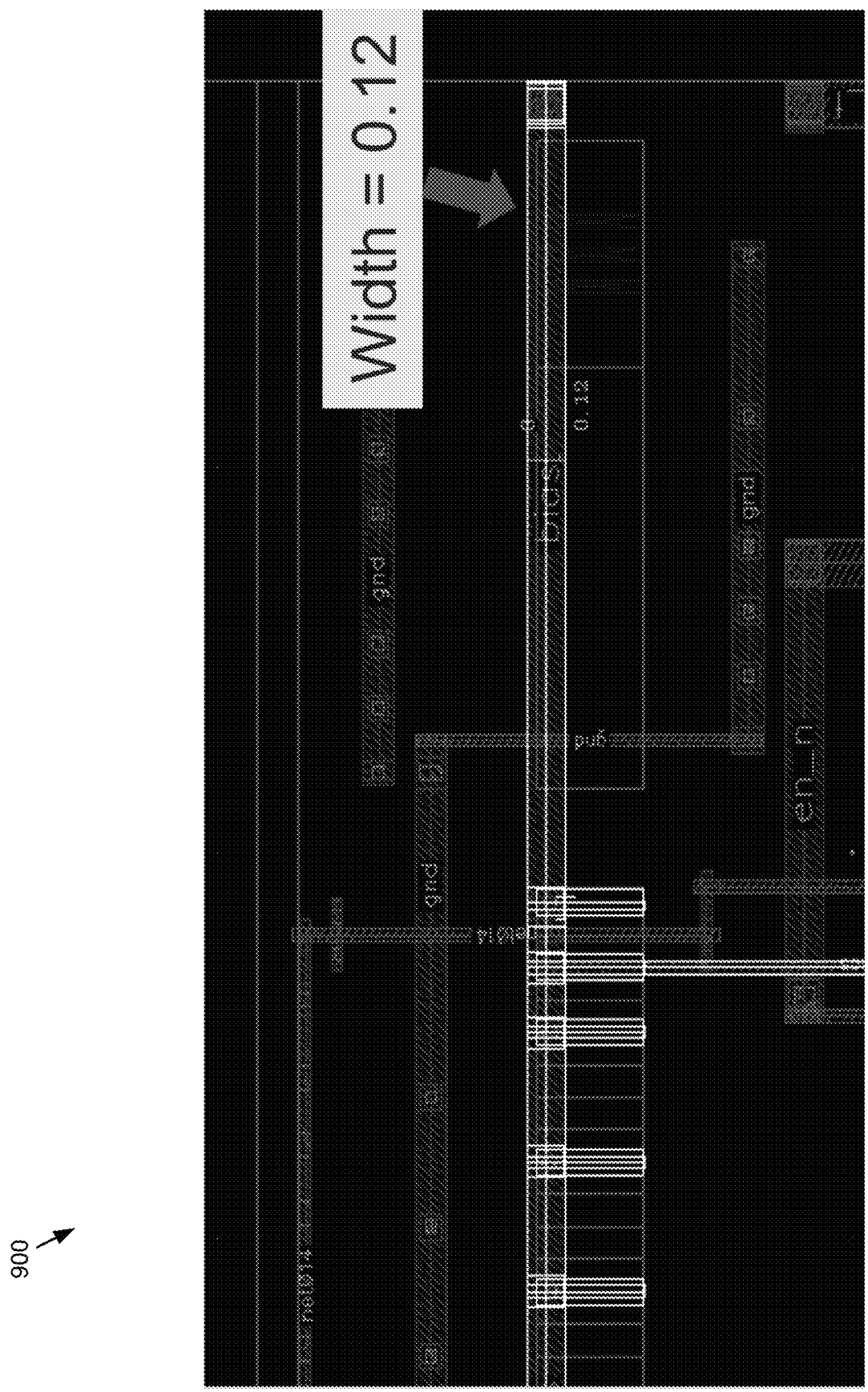
FIG. 9 depicts a closer view of the example WSP of FIG. 8 showing track widths.

FIG. 8 depicts the example WSP for the cell: "bias_amp" and the net: "bias" created using multi-width routing using EM-aware WSP. As shown in FIG. 9, the track width for the net "bias" is equal to 0.12 microns. EM-aware WSP generation process 10 made the track width larger to account for the required demands, such as current requirements.

In some embodiments, such as those utilizing multi-width routing using EM-aware WSP, as in FIG. 8 and FIG. 9, circuit simulation may be completed to get the pin-currents. EM rules may be utilized to calculate widths to support those currents. The EM rules may be received from a foundry or from any suitable source as is known in the art. Since these calculations are done in the pre-layout stage the calculations may be pessimistic. Pins may be resized as per the recommendations and EM-aware WSP generation process 10 may create tracks for the required different pin-widths. The number of tracks and periodicity of tracks may be dependent on the placement of devices and the number/location of rows they occupy. Pins may be placed as per the optimum wire-length and appropriate tracks. The router then may take the guidance from WSP tracks and the pin information to use the specific tracks for its routing. Routing resources need to be utilized effectively or the pins for power/ground may get very wide. Using the teachings of the present disclosure a routing may be generated that is free from any electromigration issues, thus reducing the corrections required after the user signs off their layout.

Figure 10:
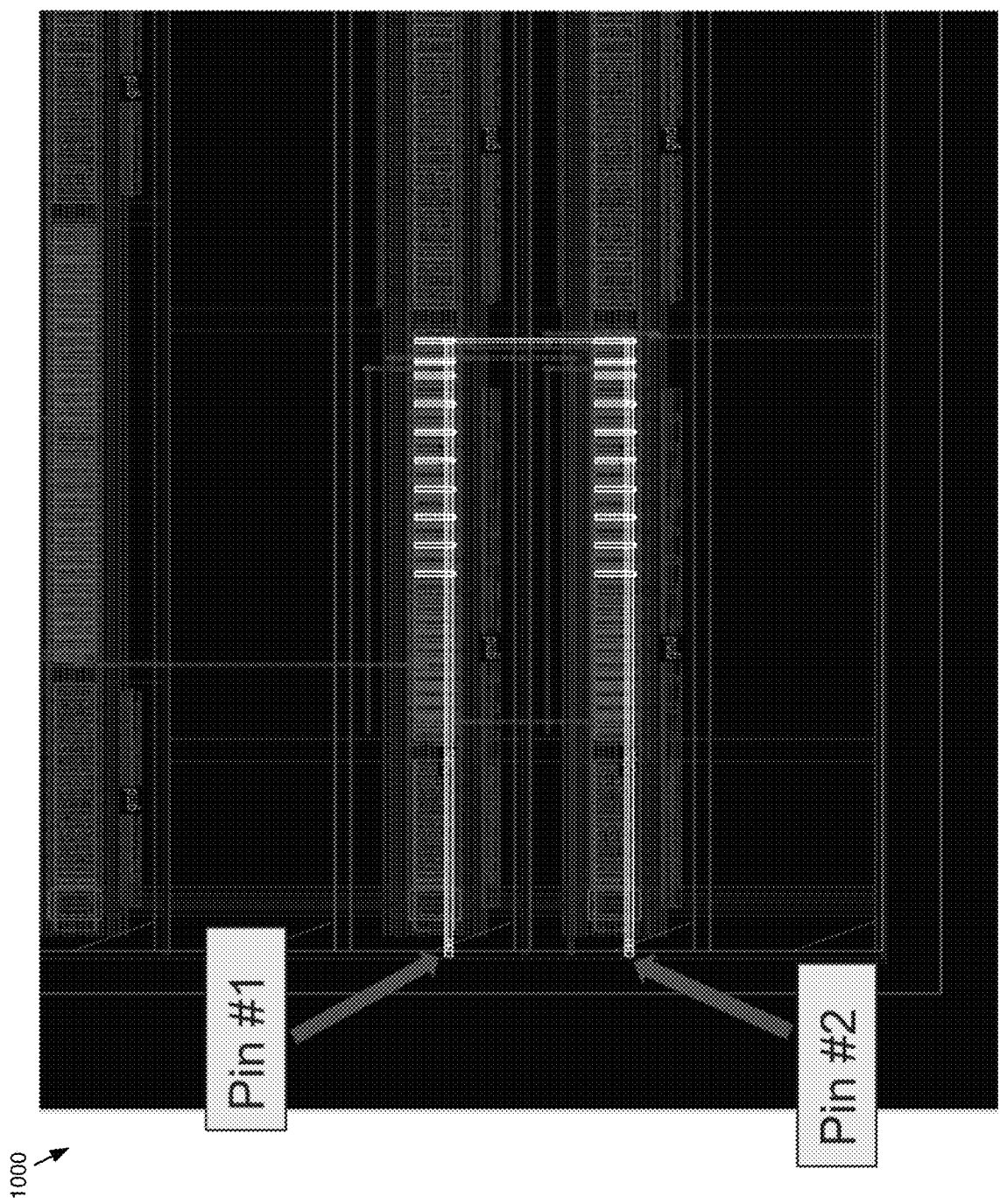
FIG. 10 is an example WSP depicting tracks generated from WSP generation engine utilizing multi-width routing option with pin splitting in accordance with an embodiment of the present disclosure.
Figure 11:
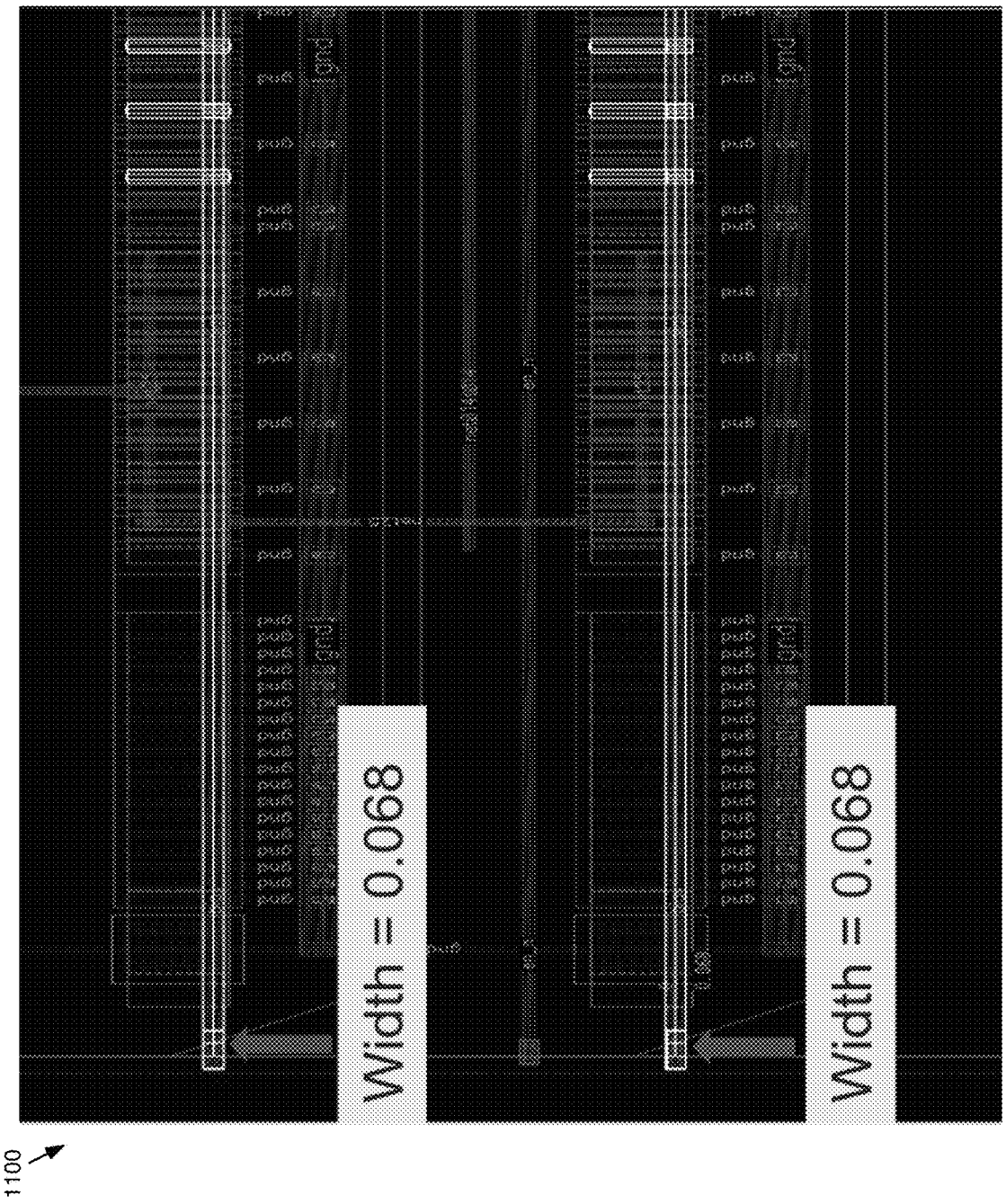
FIG. 11 is a closer view of the example WSP of FIG. 10 showing track widths.

Referring now to FIG. 10 an example WSP for the cell: "bias_amp" and the net: "bias" is provided. In this example, a multi-width routing with pin-splitting approach was utilized. As shown in FIG. 11, the track width for both pins connected to the net "bias" is equal to 0.068 microns. WSP generation process 10 split the pins and the associated tracks to account for the required demands, such as current requirements and pin size.

In embodiments utilizing multi-width routing with pin-splitting, such as those depicted in FIG. 10 and FIG. 11, wide pins may be split into multiple pins. A "large" or "wide" pin may refer to a pin larger than a predetermined threshold value (e.g., two times the min-width, etc.). WSP generation process 10 may take into account numerous factors to determine how many pins are created from the target wide pin. For example, the factors may include, but are not limited to, the number of rows to which that pin needs to connect, the maximum current requirement across all rows to which the net connects, the min-width restriction for the layer, etc. For example, if the min-width for pin-layer is 0.1 microns and target pin has a pin-width of 0.66 microns, then there can be at-most 6 pins of width 0.11 microns each. Additionally, if the target pin connects to only 3 rows, then it may be optimal to have 3 pins of 0.22 microns width each. Utilizing multi-width routing with pin-splitting may allow for a better utilization of resources and reduce layout boundary since the tracks are of lesser width. However, the benefits to multi-width routing with pin splitting may be balanced against added complexity for the router to make decision on the optimum pin to connect.

Referring also to FIGS. 12-15, various diagrams depicting different examples of handling internal nets in accordance with the present disclosure are provided. WSP generation process 10 may identify source and sink device terminals in each net connection. This identification may be performed based on the current information. The current information may be received from any suitable source, such as the EAD dataset described above. FIGS. 12-15 show example configurations for the sources and sinks. Sinks may be differentiated from sources as they include directional arrows where the arrow represents the direction of the current. A row may be represented by two parallel lines passing through the source or sink. While FIGS. 12-15 show at least two sources and sinks in each row, it should be noted that there may be any number of sources or sinks in the row.

Figure 12:
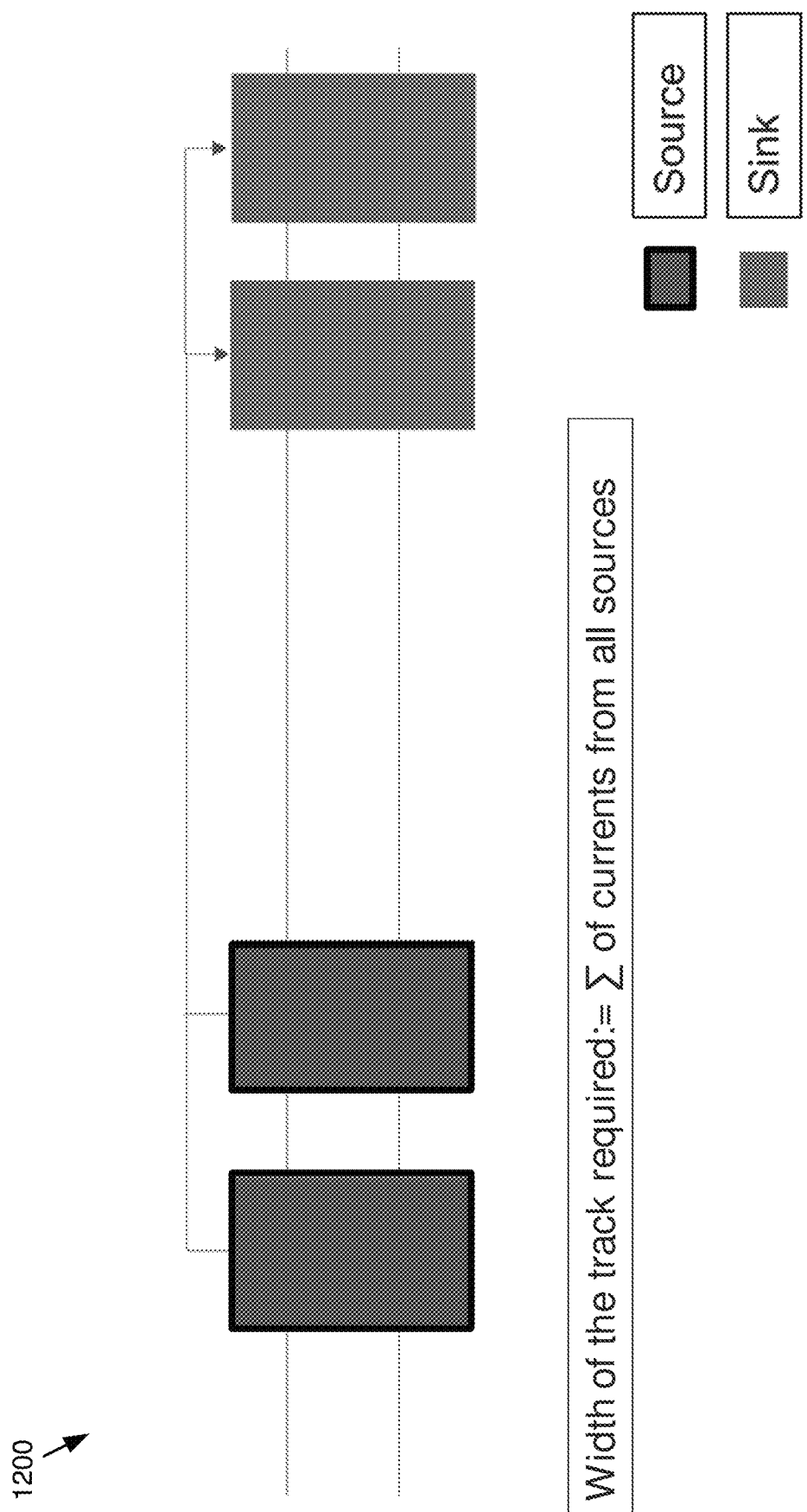
FIG. 12 is a diagram depicting an example embodiment of handling internal nets in accordance with the present disclosure.

FIG. 12 depicts an example showing sources and sinks all in a single row. In this configuration, the width of the track required may be equal to the sum of the currents from all sources.

Figure 13:
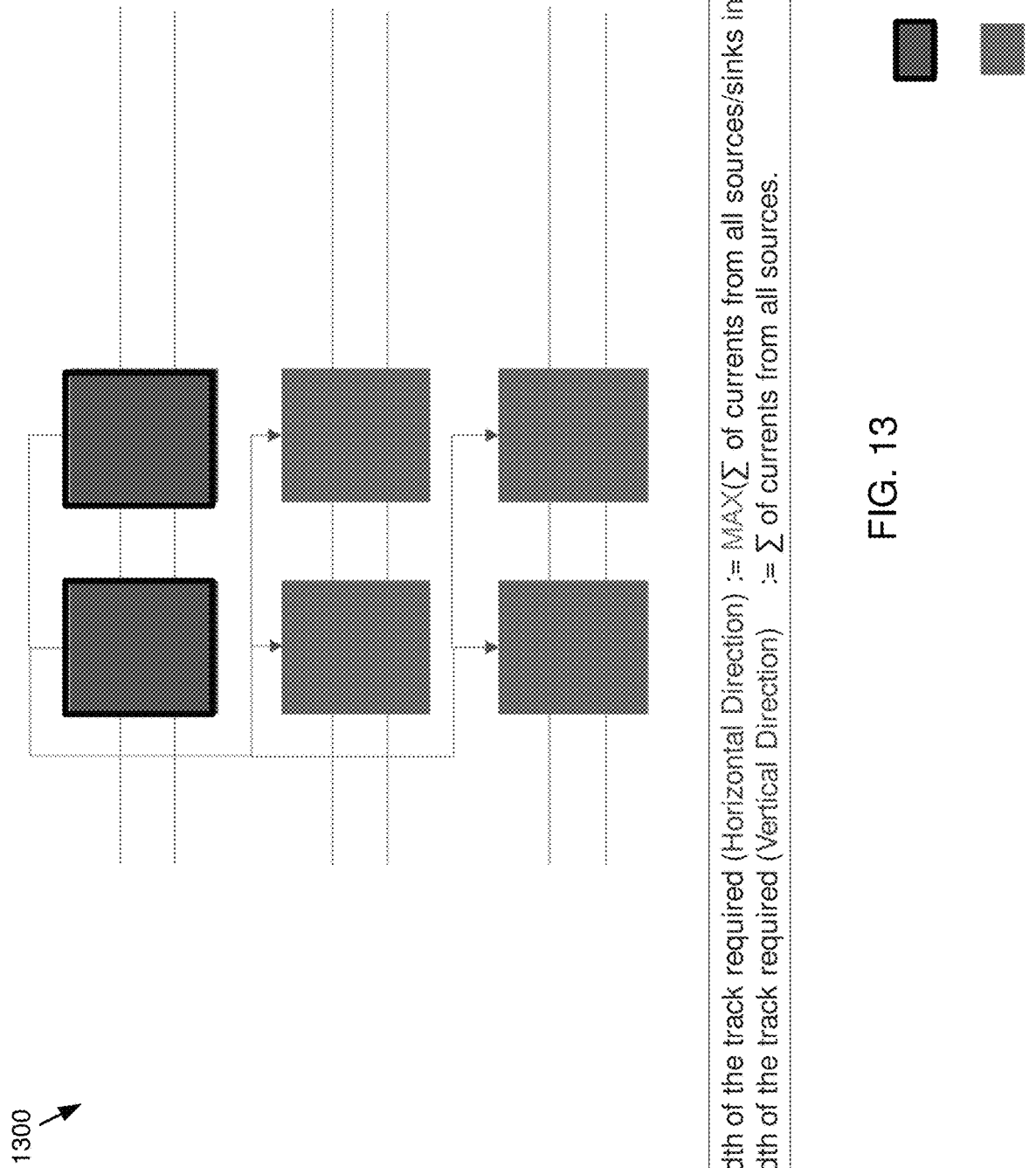
FIG. 13 is a diagram depicting an example embodiment of handling internal nets in accordance with the present disclosure.

FIG. 13 depicts an example showing sources in one row and sinks in multiple rows on one side of the sources. In this configuration, the width of the track required in the horizontal direction may be equal to the maximum of the sum of the currents from all sources or sinks in each row. The width of the track required in the vertical direction may be equal to the sum of the currents from all sources. FIG. 13 may be reversed to shows the sinks in one row but the sources in multiple rows on one side of the sinks.

Figure 14:
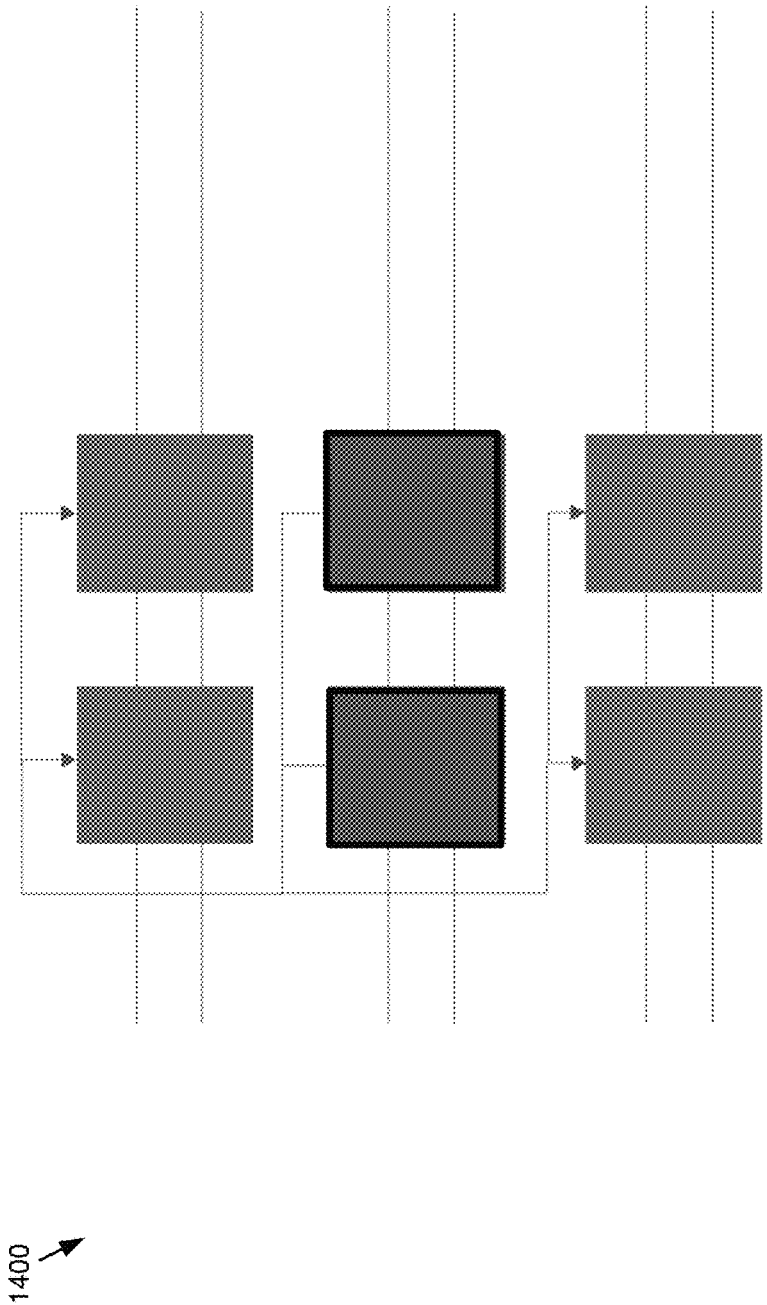
FIG. 14 is a diagram depicting an example embodiment of handling internal nets in accordance with the present disclosure.
Figure 14:
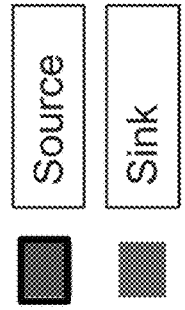

FIG. 14 depicts an example showing sources in one row but sinks in multiple rows on either side of the sources. In this configuration, the width of the track required in the horizontal direction may be equal to the maximum of the sum of the currents from all sources or sinks in each row. The width of the track required in the vertical direction may be equal to the maximum of the sum of the currents from all the sinks in rows above and below. FIG. 14 may be reversed to shows the sinks in one row but the sources in multiple rows on either side of the sinks.

Figure 15:
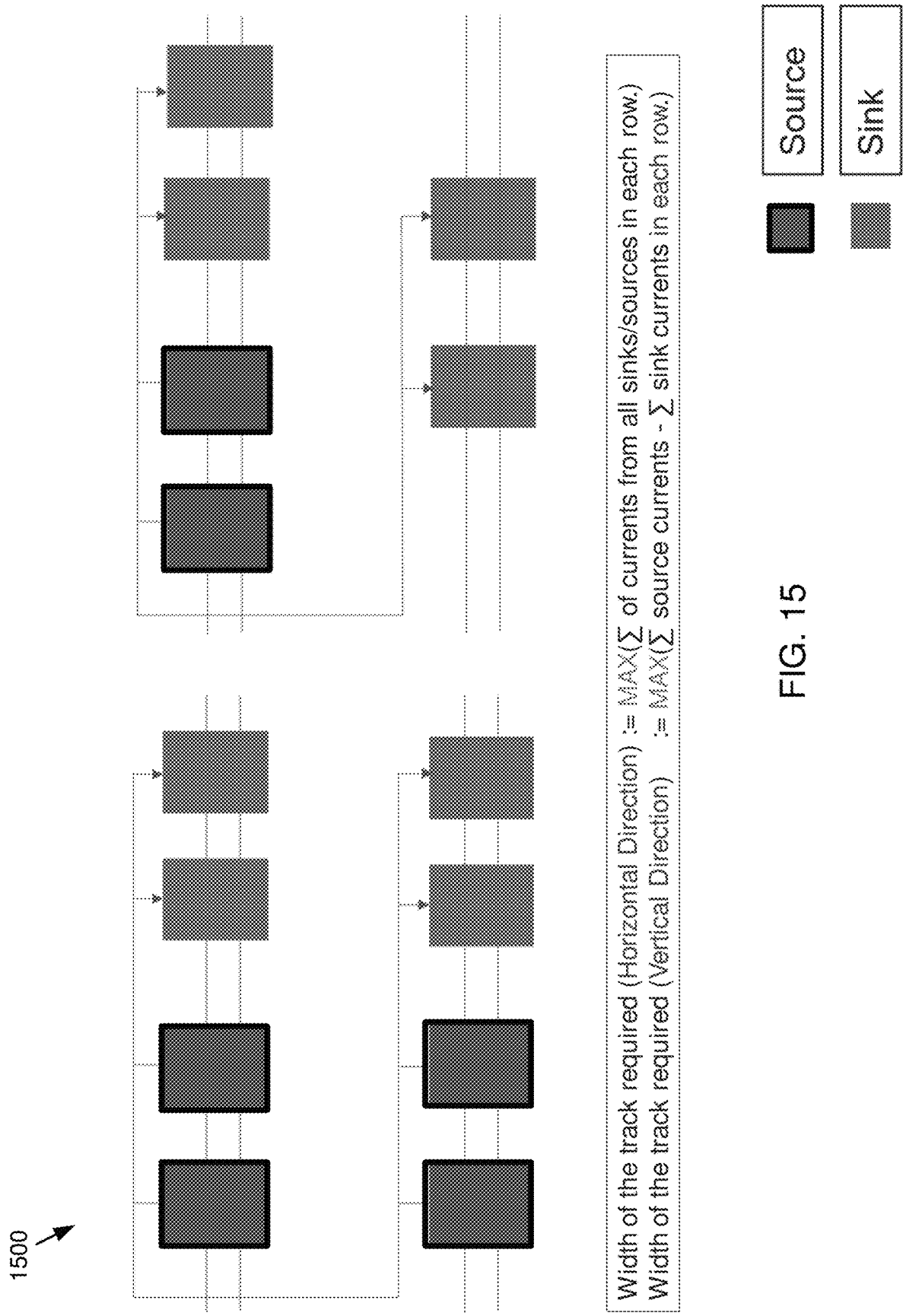
FIG. 15 is a diagram depicting an example embodiment of handling internal nets in accordance with the present disclosure.

FIG. 15 depicts an example showing sources and sinks are in multiple rows, but the rows used by sources may be a subset of rows used by sinks (or vice-versa). In this configuration, the width of the track required in the horizontal direction may be equal to the maximum of the sum of the currents from all sources or sinks in each row. The width of the track required in the vertical direction would be equal to the maximum of the sum of the source currents minus the sum of the sink currents in each row.

In some embodiments, such as the examples shown in FIGS. 12-15, the calculated width requirements for the tracks may be annotated on the net as a property (e.g., an OpenAccess ("OA") property) The properties of the internal net may be stored in any database without departing from the scope of the present disclosure. This may allow WSP generation process 10 access to read and write these properties to pass the dataset on to subsequent processes such as routing and DRC validation. In some embodiments, there may be separate annotations for horizontal tracks and vertical tracks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design comprising:
   receiving, using at least one processor, a placed layout and one or more electronic design simulation datasets including current information associated with at least one pin;
   estimating a width to support the current information associated with the at least one pin;
   updating a pin size associated with the at least one pin based upon, at least in part, the estimated width;
   identifying at least one pin that is above a predetermined threshold;
   splitting the at least one pin that is above the predetermined threshold into a plurality of pins; and
   generating one or more width-spacing-pattern tracks for one or more internal nets based upon, at least in part, the updated pin size.

2. The computer-implemented method for electronic design of claim 1, wherein generating, is based upon, at least in part, a location of one or more devices at the placed layout.

3. The computer-implemented method for electronic design of claim 1, wherein splitting is based upon, at least in part, a number of rows associated with one or more devices at the placed layout.

4. The computer-implemented method for electronic design of claim 1, wherein generating includes determining a width of the one or more width-spacing-pattern tracks.

5. The computer-implemented method for electronic design of claim 1, wherein generating includes determining a periodicity of the one or more width-spacing-pattern tracks.

6. The computer-implemented method for electronic design of claim 1, wherein receiving includes receiving current information for at least one device terminal pair associated with an internal net.

7. The computer-implemented method for electronic design of claim 6, wherein the current information for at least one device terminal pair includes source information and sink information.

8. The computer-implemented method for electronic design of claim 7, wherein generating a width of the one or more width-spacing-pattern tracks is based upon, at least in part, the source information and the sink information.

9. A non-transitory computer-readable storage medium having stored thereon instructions, which when executed by a processor result in one of more operations for electronic design, the operations comprising:
   receiving, using at least one processor, a placed layout and one or more electronic design simulation datasets including current information associated with at least one pin;
   estimating a width to support the current information associated with the at least one pin;
   updating a pin size associated with the at least one pin based upon, at least in part, the estimated width;
   identifying at least one pin that is above a predetermined threshold;
   splitting the at least one pin that is above the predetermined threshold into a plurality of pins; and
   generating one or more width-spacing-pattern tracks for one or more internal nets based upon, at least in part, the updated pin size.

10. The non-transitory computer-readable storage medium of claim 9, wherein generating, is based upon, at least in part, a location of one or more devices at the placed layout.

11. The non-transitory computer-readable storage medium of claim 9, wherein splitting is based upon, at least in part, a number of rows associated with one or more devices at the placed layout.

12. The non-transitory computer-readable storage medium of claim 9, wherein generating includes determining a width of the one or more width-spacing-pattern tracks.

13. The non-transitory computer-readable storage medium of claim 9, wherein generating includes determining a periodicity of the one or more width-spacing-pattern tracks.

14. The non-transitory computer-readable storage medium of claim 9, wherein receiving includes receiving current information for at least one device terminal pair associated with an internal net.

15. The non-transitory computer-readable storage medium of claim 14, wherein the current information for at least one device terminal pair includes source information and sink information.

16. The non-transitory computer-readable storage medium of claim 15, wherein generating a width of the one or more width-spacing-pattern tracks is based upon, at least in part, the source information and the sink information.

17. An electronic design system comprising:
a memory; and
at least one processor configured to receive a placed layout and one or more electronic design simulation datasets including current information associated with at least one pin, the at least one processor further configured to estimate a width to support the current information associated with the at least one pin, the at least one processor further configured to update a pin size associated with the at least one pin based upon, at least in part, the estimated width, the at least one processor further configured to identify at least one pin that is above a predetermined threshold and to split the at least one pin that is above the predetermined threshold into a plurality of pins, the at least one processor further configured to generate one or more width-spacing-pattern tracks for one or more internal nets based upon, at least in part, the updated pin size.

18. The system of claim 17, wherein generating, is based upon, at least in part, a location of one or more devices at the placed layout.

19. The system of claim 17, wherein splitting is based upon, at least in part, a number of rows associated with one or more devices at the placed layout.

20. The system of claim 17, wherein generating includes determining a width of the one or more width-spacing-pattern tracks.

* * * * *